United States Patent
Pagini

(10) Patent No.: US 10,165,698 B2
(45) Date of Patent: Dec. 25, 2018

(54) ANODE TERMINAL FOR REDUCING FIELD ENHANCEMENT

(71) Applicant: KIMTRON, INC., Oxford, CT (US)

(72) Inventor: Jeffrey M. Pagini, Thomaston, CT (US)

(73) Assignee: KIMTRON, INC., Oxford, CT (US)

( * ) Notice: Subject to any disclaimer, the term of this patent is extended or adjusted under 35 U.S.C. 154(b) by 0 days.

(21) Appl. No.: 15/350,436

(22) Filed: Nov. 14, 2016

(65) Prior Publication Data

US 2017/0303417 A1 Oct. 19, 2017

Related U.S. Application Data

(60) Provisional application No. 62/254,385, filed on Nov. 12, 2015.

(51) Int. Cl.
| | |
|---|---|
| *H05K 5/00* | (2006.01) |
| *H05K 5/02* | (2006.01) |
| *H01B 5/00* | (2006.01) |
| *H01R 24/20* | (2011.01) |

(Continued)

(52) U.S. Cl.
CPC ........... *H05K 5/0247* (2013.01); *H01B 5/002* (2013.01); *H01R 24/20* (2013.01); *H01T 19/00* (2013.01); *H01T 19/02* (2013.01)

(58) Field of Classification Search
CPC ......... H05K 5/00; H05K 5/02; H05K 5/0247; H01B 5/00; H01B 5/004; H01R 24/00; H01R 24/20; H01T 19/00; H01T 19/02
USPC ............ 174/51, 140 CR, 145, 137 R, 138 R; 439/98, 100; 361/600, 601, 641, 799, 361/800
See application file for complete search history.

(56) References Cited

U.S. PATENT DOCUMENTS

| | | |
|---|---|---|
| 3,209,213 A | 9/1965 | Pakala et al. |
| 3,626,085 A | 12/1971 | Arndt et al. |
| 3,629,488 A | 12/1971 | Mixon, Jr. |

(Continued)

FOREIGN PATENT DOCUMENTS

| | | |
|---|---|---|
| DE | 2747486 | 4/1979 |
| DE | 102009034646 | 9/2010 |

(Continued)

OTHER PUBLICATIONS

Hernandez-Guiteras, J. et al., Abstract of "Redesign of a spherical corona shield for UHV substation connectors," IEEE, Power Engineering, Fourth International Conference, May 13-17, 2013, pp. 384-389. http://ieeexplore.ieee.org/xpl/login.jsp?tp=&arnumber=6635637&url=http%3A%2F%2Fieeexplore.ieee.org%2Fxpls%2Fabs_all.jsp%3D6635637.

(Continued)

*Primary Examiner* — Angel R Estrada
(74) *Attorney, Agent, or Firm* — Ware, Fressola, Maguire & Barber LLP

(57) ABSTRACT

An anode terminal is provided for use high voltage applications that also serves as a shield, and which reduces the overall size of the anode terminal and an enclosure containing the anode terminal. The anode terminal includes a toroid and the maximum radius of curvature that is required to provide an optimal field enhancement reduction is reserved for the section of the toroid that is closest to ground, including the walls of the enclosure. The toroid of the anode terminal has variable radii of curvature along its outer surface and is asymmetrical.

20 Claims, 6 Drawing Sheets

(51) Int. Cl.
*H01T 19/00* (2006.01)
*H01T 19/02* (2006.01)

(56) References Cited

U.S. PATENT DOCUMENTS

| | | | |
|---|---|---|---|
| 3,828,116 A | 8/1974 | Lonow | |
| 4,079,189 A | 3/1978 | Troccoli | |
| 4,164,620 A | 8/1979 | Hervig | |
| 4,241,004 A | 12/1980 | Hervig | |
| 4,365,947 A | 12/1982 | Bahder et al. | |
| 4,991,194 A * | 2/1991 | Laurent | H01J 35/10 378/124 |
| 5,310,987 A | 5/1994 | Rutz | |
| 5,473,116 A | 12/1995 | Humphrey et al. | |
| 5,488,199 A | 1/1996 | Selsing et al. | |
| 5,506,881 A | 4/1996 | Ono et al. | |
| 5,583,906 A | 12/1996 | Sugiura et al. | |
| 6,570,962 B1 | 5/2003 | Maska et al. | |
| 6,844,806 B1 | 1/2005 | Lehmann | |
| 7,079,625 B2 * | 7/2006 | Lenz | B23H 7/108 378/127 |
| 7,375,933 B2 | 5/2008 | Tekletsadik | |
| 7,557,563 B2 | 7/2009 | Gunn et al. | |
| 7,837,136 B2 | 11/2010 | Yamada et al. | |
| 8,946,657 B2 | 2/2015 | Apel et al. | |
| 9,543,108 B2 * | 1/2017 | Roedhammer | H01J 35/10 |
| 2014/0009353 A1 | 1/2014 | Moreau et al. | |

FOREIGN PATENT DOCUMENTS

| | | |
|---|---|---|
| GB | 930017 | 7/1963 |
| KR | 101107038 | 1/2012 |
| KR | 101238141 | 2/2013 |
| WO | 2008044986 | 4/2008 |

OTHER PUBLICATIONS

Kaumanns, J. et al., "400KV XLPE-Insulated Cable Systems With Dry Plug-in Outdoor Terminations," Jicable, 2007, 4 pages. http://www.jicable.org/2007/Actes/Session_A1/JIC07_A12.pdf.

* cited by examiner

ANODE TERMINAL FOR REDUCING FIELD ENHANCEMENT

CROSS-REFERENCE TO RELATED APPLICATIONS

The present application claims the benefit of U.S. Provisional Patent Application No. 62/254,376, filed Nov. 12, 2015, which is incorporated by reference in its entirety.

FIELD OF THE INVENTION

The present invention relates to an anode terminal for reducing field enhancement in, for example, a high voltage power supply. An asymmetrical geometry causes high voltage fields to act as though the tank housing the high voltage terminal is dimensionally larger than its actual size.

BACKGROUND OF THE INVENTION

X-Ray and other high voltage power supplies (HVPS) often require an interface to an output cable that is convenient to connect and reconnect. Commonly this is accomplished by means of a plug and socket arrangement, where the socket is called a "cable well" or "well". Inside the HVPS enclosure, the cable well looks like a cylinder attached to one side of the enclosure with its axis perpendicular to that side of the enclosure.

An example of an HVPS enclosure 10a according to the prior art is shown in FIG. 1.

The enclosure 10a may be a sheet metal box containing a quantity of insulating medium 15, such as transformer oil or oil. The end of the cable well 20 attached to a wall of the box 10a is the ground or low voltage end 21. The other, opposing end 22 is the high voltage end 22 of the cable well 20. The high voltage end 22 contains the actual high voltage terminal, which connects to the inner conductor or conductors of the cable of the cable well 20, and to the source of high voltage inside the box or tank 10a. The size of the cable well 20 is determined by its voltage rating. A higher voltage means a greater well length. The diameter $D_1$ of the cable well 20 must be large enough to accommodate the outer diameter (OD) of the cable plus the outer diameter of the socket parts plus an adequate thickness of insulating material, commonly epoxy.

An illustrative embodiment of the present invention is designed for a HVPS with a voltage range from 100 to 200 kV and is used with a cable well 20 suitable for that voltage range, having a length $L_1$ of 7 inches and a diameter $D_1$ of 3 inches.

The high voltage terminal at the high voltage end 22 of the cable well 20 may comprise a trio of threaded studs or recessed threaded holes (not shown) to receive screws or studs. The high-voltage terminals are themselves quite small and if high voltage wires were attached to the terminals with no attempt at shielding, a well-known phenomenon known as "Field Enhancement" would cause a severe case of corona, almost certainly leading to high voltage arcing.

Field enhancement can be greatly reduced by increasing the size and radius of curvature of high voltage terminals. The required radius of curvature of a terminal is governed by the operating voltage, the insulating medium 15 and the distance $D_2$ to the nearest point of low voltage or "Ground". A ratio of 1.5:1 relating the distance $D_2$ to ground to the radius of curvature of the high voltage terminal 30 provides a close to optimum reduction in field enhancement. For the voltage range of interest (i.e., 100 kV-200 kV) and for an insulating medium such as oil, 4.5 inches is an adequate but not extravagant distance $D_2$ to ground. Applying the above-referenced ratio thereby requires a radius of curvature of 3 inches in the high voltage terminal 30. Thus, the high voltage end 22 of the cable well 20 would have to be surrounded by a conducting structure, commonly aluminum or brass, which would have an outside radius of curvature of at least 3 inches and would shield the much smaller terminals on the high voltage end 22 of the well 20 from ground.

A very common realization of this "Corona Shield" is shown in the high voltage anode terminal 30 of FIG. 1, which includes a toroid or donut shaped solid 31. The toroid 31 could also be machined on a lathe. Such a toroid 31 would have a cross sectional diameter $D_3$ of 6 inches, which would provide the required radius of curvature of 3 inches. The donut hole or center of the toroid 31 would have a diameter $D_1$ of 3 inches and would be plugged by a thin (relative to the diameters) disc 32, made of the same material of the toroid 31. Holes (not shown) in this disc 32 engage the three studs or threaded holes in the end 22 of the cable well 20 to make the high voltage connection. The overall outer diameter $D_4$ of this shield 30 would be quite large at about 15 inches, which is five times the diameter $D_1$ of the cable well 20. With another 4.5 inches of insulating space on each side of the toroid 31, corresponding to the distance $D_2$ to ground, the minimum distance $D_5$ between walls of the tank 10a would be 24 inches. This far exceeds the dimensions of any of the high voltage generating components in the tank 10a and is a tremendous waste of space, which greatly increases the cost of the tank 10a and cost of the oil medium 15 needed to fill the tank 10a.

The problem with this "traditional" terminal having a circular cross-section is that the radius of curvature of 3 inches is maintained both outside and inside the toroid 31, thus resulting in a toroid 31 that has a diameter $D_3$ of 6 inches, or twice the radius. The radius inside the toroid 31 is unnecessary since it is not looking at ground.

Thus, what is needed is a high voltage anode terminal that can meet the use requirements and reduce field enhancement and arcing, while also conserving physical space and reducing the overall cost of the high-voltage power supply.

SUMMARY OF THE INVENTION

The present invention solves the shortcomings in the art by providing an anode terminal for use in a high voltage power supply and other high voltage applications that serves as a shield, and which reduces the overall size of the anode terminal and enclosure. In the anode terminal of the present invention, the anode terminal includes a toroid and the maximum radius of curvature that is required for the high voltage power supply to provide an optimal field enhancement reduction is reserved for the section of the toroid that is closest to ground (typically the walls of the enclosure). The toroid of the anode terminal has variable radii of curvature along its outer surface and is asymmetrical about a plane that intersects the toroid and is perpendicular to the cable well. The anode terminal of the present invention may be used with not only high voltage power supplies, but also other applications requiring a high voltage, including for example a voltage divider, an X-ray tube or other scientific instruments.

In accordance with a first aspect of the invention, an apparatus is provided, comprising an enclosure containing a cable well and an anode terminal. The cable well includes a ground end affixed to a wall of the enclosure and a high voltage end opposing the ground end. The anode terminal is affixed to the high voltage end of the cable well, comprising a toroid configured to reduce arcing. The toroid of the anode terminal comprises an outer surface having a plurality of radii of curvature. The largest radius of curvature of the outer surface of the toroid of the anode terminal is at a section around the outer surface of the toroid having one or more points on the outer surface that are closest to the enclosure, particularly to a wall of the enclosure.

In accordance with an embodiment of the apparatus of the first aspect of the invention, the anode terminal further comprises a disc in a hole in a center of the toroid configured to connect the anode terminal to the high voltage end of the cable well.

In accordance with a further embodiment of the apparatus of the first aspect of the invention, the toroid of the anode terminal is substantially perpendicular to the cable well.

In accordance with a further embodiment of the apparatus of the first aspect of the invention, the anode terminal is asymmetrical about a plane perpendicular to the cable well and parallel to the disc.

In accordance with a further embodiment of the apparatus of the first aspect of the invention, the plurality of radii of curvature of the outer surface of the toroid of the anode terminal include a plurality of intermediate radii of curvature less than the largest radius of curvature.

In accordance with a further embodiment of the apparatus of the first aspect of the invention, the corners of the toroid facing the center of the toroid are rounded.

In accordance with a further embodiment of the apparatus of the first aspect of the invention, the apparatus further comprises an insulating medium in the enclosure surrounding the cable well and the anode terminal.

In accordance with a further embodiment of the apparatus of the first aspect of the invention, the anode terminal, including the toroid and the disc, are made from aluminum. In a further embodiment, the anode terminal, including the toroid and disc, can be made from brass.

In accordance with a further embodiment of the apparatus of the first aspect of the invention, the largest radius of curvature of the outer surface of the toroid of the anode terminal is approximately 3 inches and the distance between the enclosure and the one or more points along the section around the outer surface of toroid having the largest radius of curvature is approximately 4.5 inches.

In accordance with a further embodiment of the apparatus of the first aspect of the invention, the distance between the enclosure and the one or more points along the section around the outer surface of toroid having the largest radius of curvature is approximately 1.5 times greater than the largest radius of curvature of the outer surface of the toroid of the anode terminal.

In accordance with a further embodiment of the apparatus of the first aspect of the invention, the disc in the center of the toroid is offset towards a ground side of the anode terminal.

According to a second aspect of the invention, an apparatus is provided comprising an anode terminal comprising a toroid configured to reduce high voltage arcing. The toroid of the anode terminal comprises an outer surface having a plurality of radii of curvature. The largest radius of curvature of the outer surface of the toroid of the anode terminal is at a section around the outer surface of the toroid having one or more points on the outer surface that are configured to be closest to a wall of an enclosure housing the anode terminal.

In accordance with an embodiment of the apparatus of the second aspect of the invention, the anode terminal further comprises a disc in a hole in a center of the toroid configured to connect the anode terminal to a high voltage end of a cable well.

In accordance with a further embodiment of the apparatus of the second aspect of the invention, the anode terminal is asymmetrical about a plane parallel to the disc.

In accordance with a further embodiment of the apparatus of the second aspect of the invention, wherein the plurality of radii of curvature of the outer surface of the toroid of the anode terminal include a plurality of intermediate radii of curvature less than the largest radius of curvature.

In accordance with a further embodiment of the apparatus of the second aspect of the invention, corners of the toroid facing the center of the toroid are rounded.

In accordance with a further embodiment of the apparatus of the second aspect of the invention, the anode terminal, including the toroid and the disc are made from aluminum or brass.

In accordance with a further embodiment of the apparatus of the second aspect of the invention, the largest radius of curvature of the outer surface of the toroid of the anode terminal is approximately 3 inches.

In accordance with a further embodiment of the apparatus of the second aspect of the invention, the disc in the center of the toroid is offset towards a ground side of the anode terminal.

DETAILED DESCRIPTION OF THE FIGURES

Figure 1:
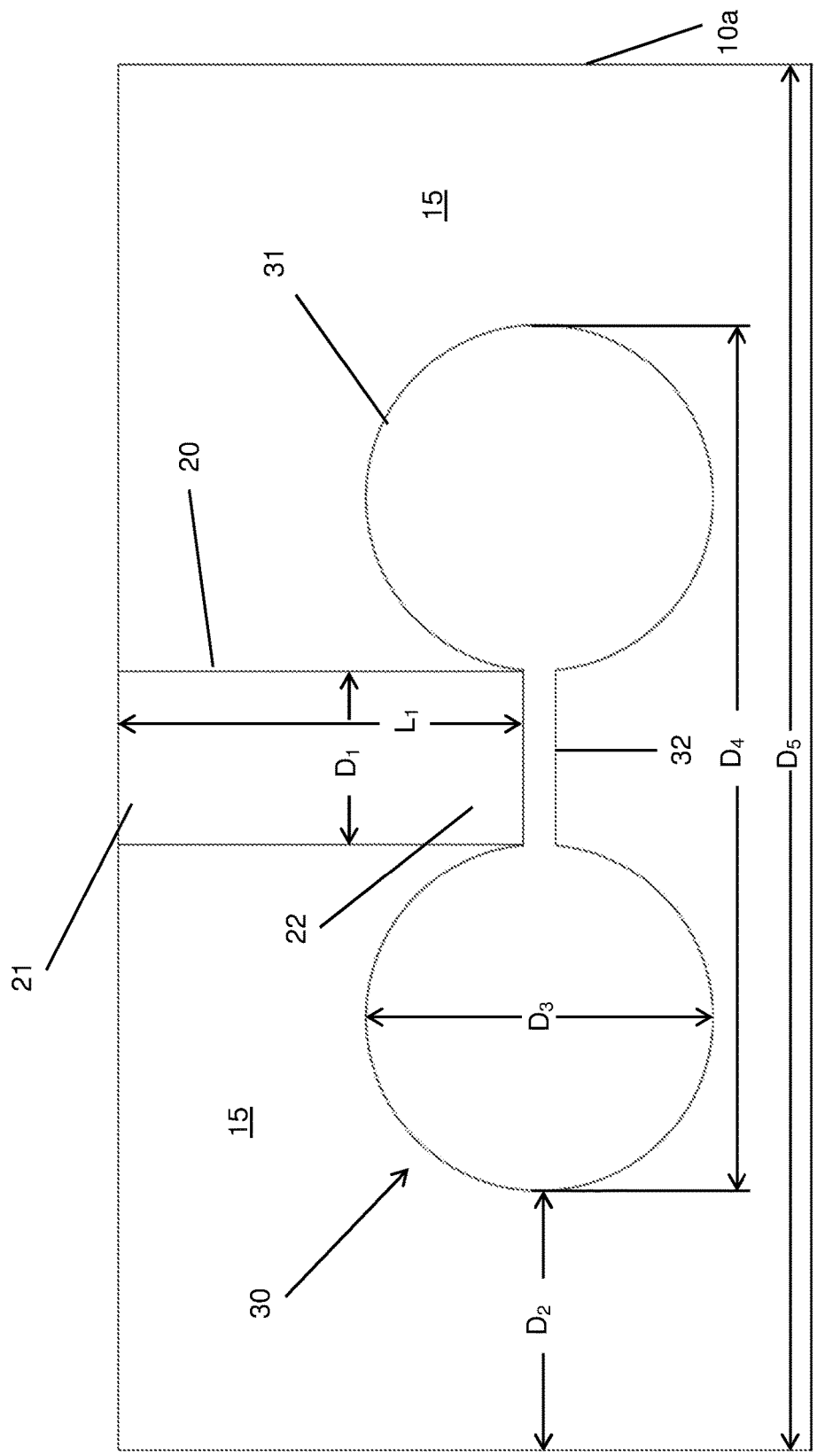
FIG. 1 shows a cross-sectional view of an embodiment of a high-voltage power supply enclosure according to the prior art.
Figure 2:
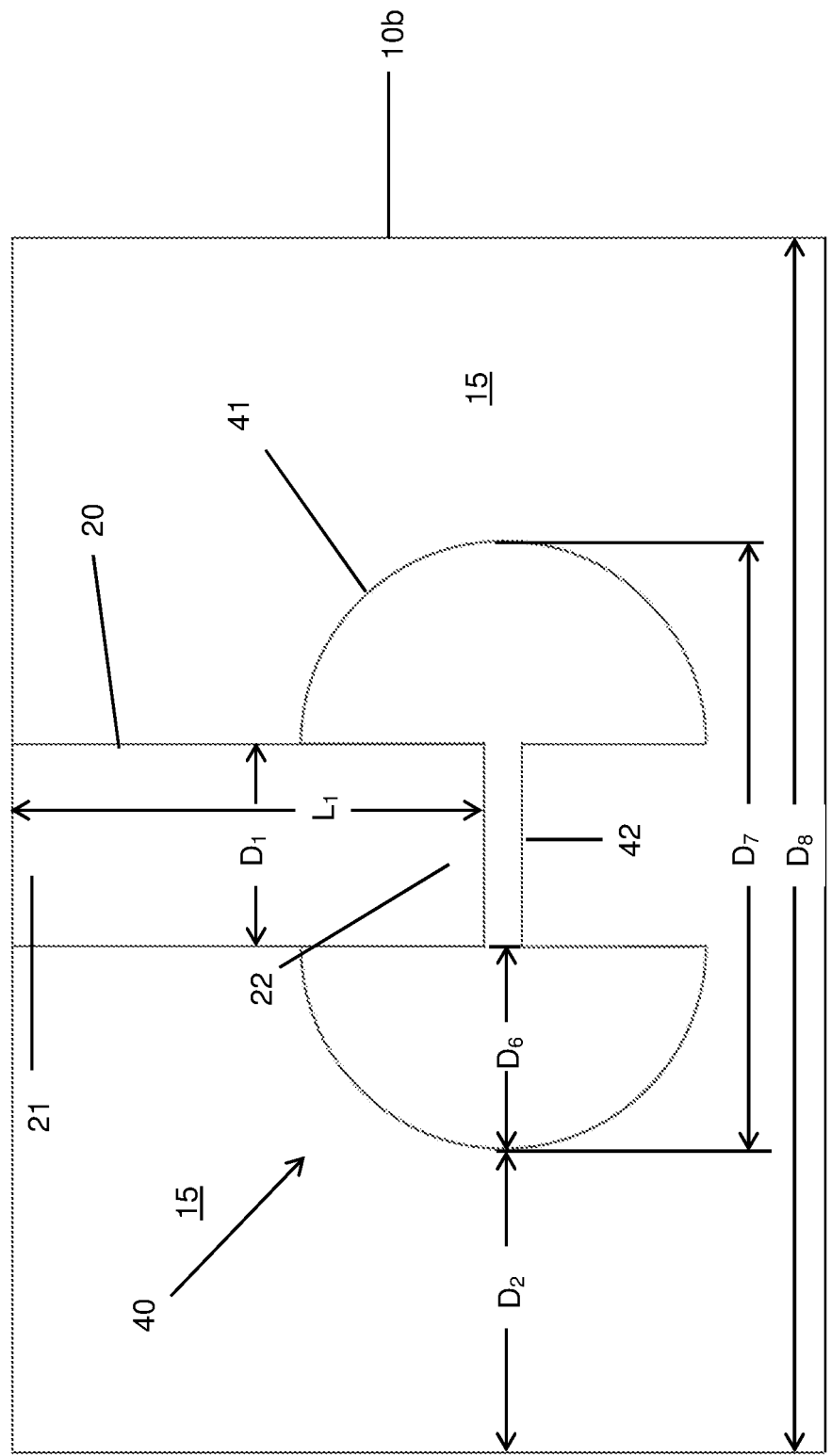
FIG. 2 shows a cross-sectional view of a further embodiment of a high-voltage power supply enclosure.

The present invention will now be described with reference made to FIGS. 2-5B. A first attempt at making the terminal 30 of FIG. 1 more space efficient is shown in the HVPS of FIG. 2. In the embodiment of FIG. 2, a cable well 20 having a ground or low voltage end 21 and a high voltage end 22, similar to the cable well 20 of FIG. 1 is provided inside a tank 10b. A high voltage anode terminal 40 is attached to the high voltage end 22 of the cable well 20, and the high voltage terminal 40 includes a toroid 41 with a center disc 42. However, in contrast to the donut-shaped toroid 31 of the high voltage anode terminal 30 of FIG. 1, the cross-sectional shape of the toroid 41 is made a half circle instead of a full circle, as shown in FIG. 2. This change in shape reduces the required overall space by 3 inches on each side of the toroid 41, in comparison to the toroid 31 of FIG. 1. The semi-circular cross-section of toroid 41 has a radius $D_6$ of 3 inches and the distance $D_2$ from the toroid 41 to ground is 4.5 inches. Therefore, the preferred ratio of distance $D_2$ to ground to the radius of curvature of the terminal 40 is maintained. With the diameter of the disc 42 and the cable well diameter 20 being 3 inches, the outer diameter $D_7$ of the high voltage terminal 40 is reduced to 9 inches and the tank width $D_8$ is reduced to 18 inches.

However, there is a serious flaw in this arrangement because the half circle has sharp corners resulting in edges that are worse than the original small terminals. Furthermore, the side of the terminal 40 facing ground encroaches 3 inches along the length $L_1$ of the cable well 20, reducing its effective insulating length to a very inadequate 4 inches.

The present invention avoids these problems by providing a high voltage anode terminal comprising multiple radii of curvature along the outer surface of the toroid of the anode terminal. Smaller radii of curvature are introduced into the cross-section of the toroid, reserving the largest radius of curvature for only the outside surface facing ground. The corners of the intermediate step above are rounded on the ground side and 0.25 inches on the high voltage side.

Figure 3:
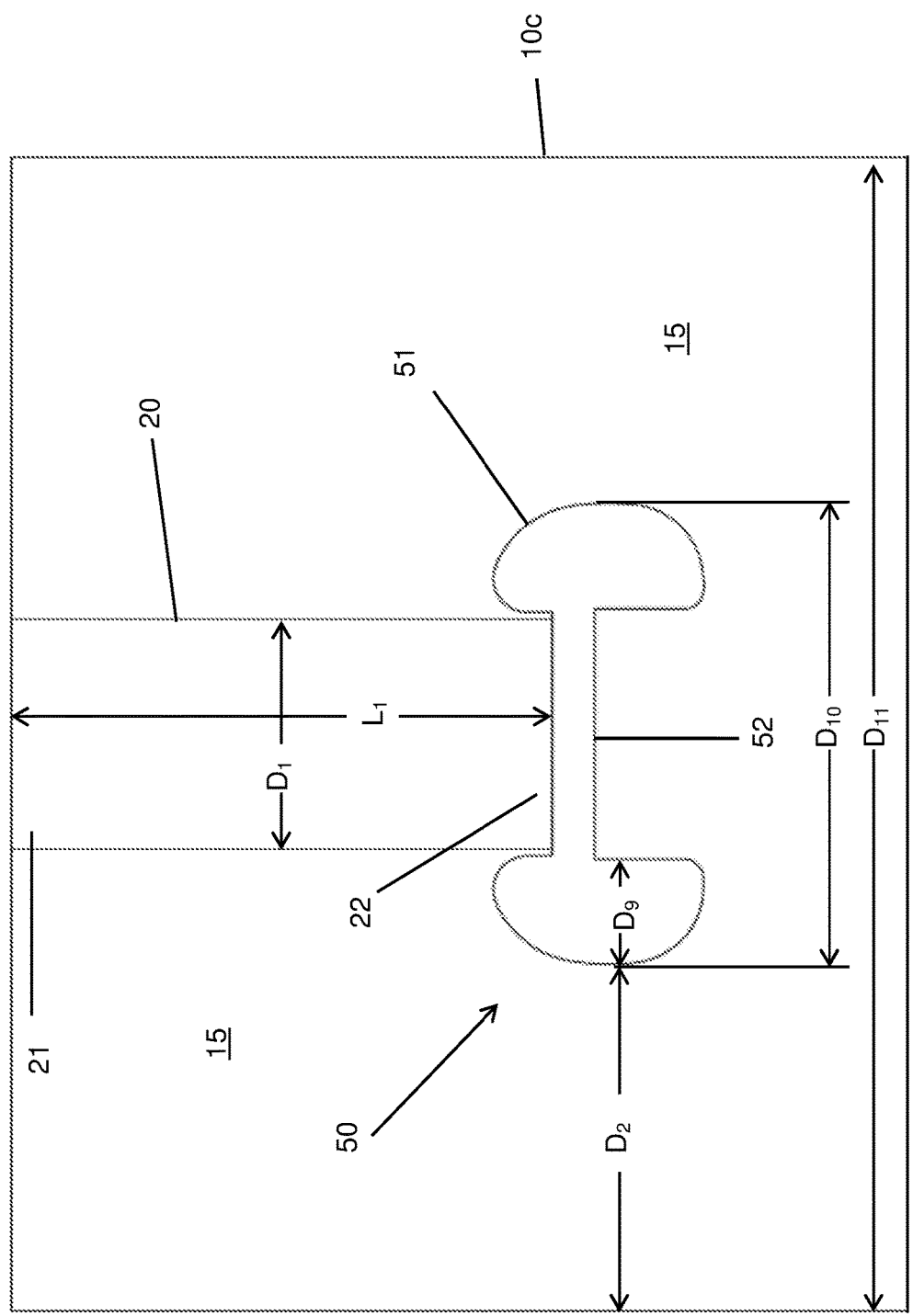
FIG. 3 shows a cross-sectional view of a first embodiment of the invention including a high voltage anode terminal in an enclosure, in accordance with the present invention.
Figure 4:
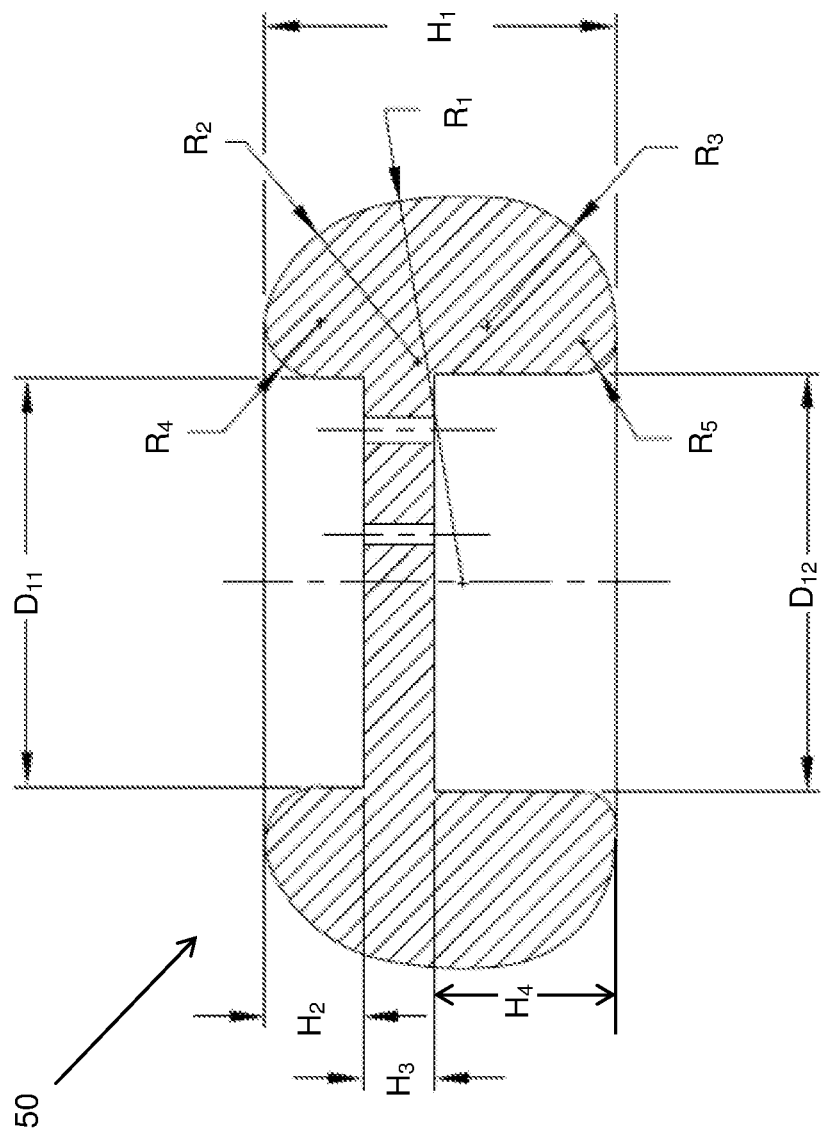
FIG. 4 shows a cross-sectional view of a first embodiment of a high voltage anode terminal in accordance with the present invention.

An example of an embodiment of the present invention is shown in FIGS. 3 and 4.

In accordance with an embodiment of the present invention, a tank 10c is provided, which is filled with an insulating medium 15 and includes a cable well 20 having a ground end 21 and a high voltage end 22. A high voltage anode terminal 50 is provided, comprising a toroid 51 surrounding a center disc 52. The high voltage anode terminal, including the toroid 51 and center disc 52 may be made from materials such as aluminum or brass. The high voltage end 22 of the cable well 20 can be attached to the center disc 52 by inserting a plurality of screws through openings in the cable well 20 and disc 52, as previously described in the embodiment of FIG. 1. In an illustrative embodiment, the cable well 20 may have a diameter $D_1$ of 3 inches and a length $L_1$ of 7 inches, consistent with previously described embodiments. However, it is noted that the dimensions of the cable well 20 can vary in other embodiments, and the cable well 20 diameter $D_1$ and length $L_1$ are not limited to 3 inches and 7 inches, respectively.

In contrast to the terminals 30, 40 of FIGS. 1 and 2, the outer surface of the toroid 51 of the terminal 50 does not have a constant radius of curvature. The terminal 50 has multiple radii of curvature, which vary along the outer surface of the toroid 51. The section around the outer surface of the toroid 51 that is closest to ground (i.e., closest to the walls of the tank 10c) has the largest radius of curvature $R_1$. In the embodiment shown in the Figures, the largest radius of curvature $R_1$ is 3 inches. The distance $D_2$ to ground between the toroid 51 at the points having this radius of curvature $R_1$ is 4.5 inches, and as a result, a 1.5:1 ratio of distance $D_2$ to ground to terminal radius of curvature $R_1$ is provided. In embodiments where the tank 10c is cylindrical in shape having a circular cross-section, the distance $D_2$ to ground from the toroid 51 may extend along a section around the entire perimeter of the toroid, and in embodiments where the tank 10c is a cube or box having a square, rectangular or other polygonal cross-section, the toroid 51 may be closest to ground at discrete points along a section around the perimeter of the toroid 51.

The remainder of the outer surface of the toroid 51 does not require a radius of curvature $R_1$ that is approximately two-thirds the distance $D_2$ to ground. To smooth out between the largest radius of curvature $R_1$ and the smaller radii of curvature around the outer surface of the toroid 51, intermediate radii of curvature are introduced. For example, in accordance with one embodiment of the invention, an intermediate radius of curvature $R_2$ of 1.25 inches can be provided on the ground side of the toroid 51 and an intermediate radius of curvature $R_3$ of 1 inch can be provided on the high voltage side of the toroid 51.

The corners of the intermediate step above the maximum radius of curvature $R_1$ and intermediate radii of curvature $R_2$, $R_3$ can be rounded. In the embodiment shown in the Figures, the corners of the toroid 51 can be rounded to a radius of curvature $R_4$ of approximately 0.44 inches on the ground side and a radius of curvature $R_5$ of 0.25 inches on the high voltage side.

In the embodiment shown in the Figures and described above, the distance $D_9$ across the outer portion of the toroid 51 is approximately 1.5 inches. The resultant toroid 51 has an outer diameter $D_{10}$ of approximately 6 inches, allowing the width $D_{11}$ of the tank 10c to be reduced to 15 inches.

The center disc 52 plugging the center hole inside the toroid 51 can be offset slightly toward the ground side, resulting in a virtually negligible reduction in the well length $L_1$. In the embodiment of the terminal 50 shown in FIG. 4, the overall height $H_1$ of the terminal can be approximately 2.7 inches. With the disc 52 being slightly offset towards ground, the height $H_2$ of the ground side section of the terminal 50 can be approximately 0.75 inches, the height $H_3$ of the central portion of the terminal 50 including the center disc 52 can be approximately 0.55 inches, and the height $H_4$ of the high voltage side section of the terminal 50 can be approximately 1.4 inches. Additionally, the distance $D_{11}$ across the center of toroid 51 above the disc 52 is sufficient to receive the cable well 20, and may provide for additional space between the cable well 20 and toroid 51. This distance $D_{11}$ may be, for example, 3.17 inches where the diameter $D_1$ of the cable well 20 is 3 inches. In certain embodiments of the invention, the distance $D_{12}$ across the center of the toroid 51 below the disc 52 may be the same as or greater than the distance $D_{11}$ across the center of toroid 51 above the disc 52. For example, in the embodiment shown in FIG. 4, this distance $D_{12}$ can be 3.25 inches. The cavity in the center of the toroid 51 on the side of the disc 52 that is not attached to the cable well 20 may provide further connections (not shown). This may include, for example, a connection to a high voltage stack.

This variable radius terminal 50, in contrast to a traditional constant radius terminal 30, makes use of larger radii of curvature only where needed and smaller radii of curvature where the distances are greater or the voltages are smaller. The terminal 50 is therefore much smaller and therefore less expensive. In comparison to the tank 10a of FIG. 1, the reduced overall size of the terminal 50 of the present invention allows the volume of the tank 10c to be potentially reduced by a ratio 2.56:1 ($24^2/15^2$ or 576/225). As a result, the size and cost of the tank 10c is reduced, and the required amount of insulating medium 15 to fill the tank 10c is also reduced.

The high voltage anode terminal 50 can be used in a variety of applications requiring a high voltage without departing from the scope of the invention, including for example in high voltage power supplies, voltage dividers, X-ray tubes and other scientific instruments.

Figure 5A:
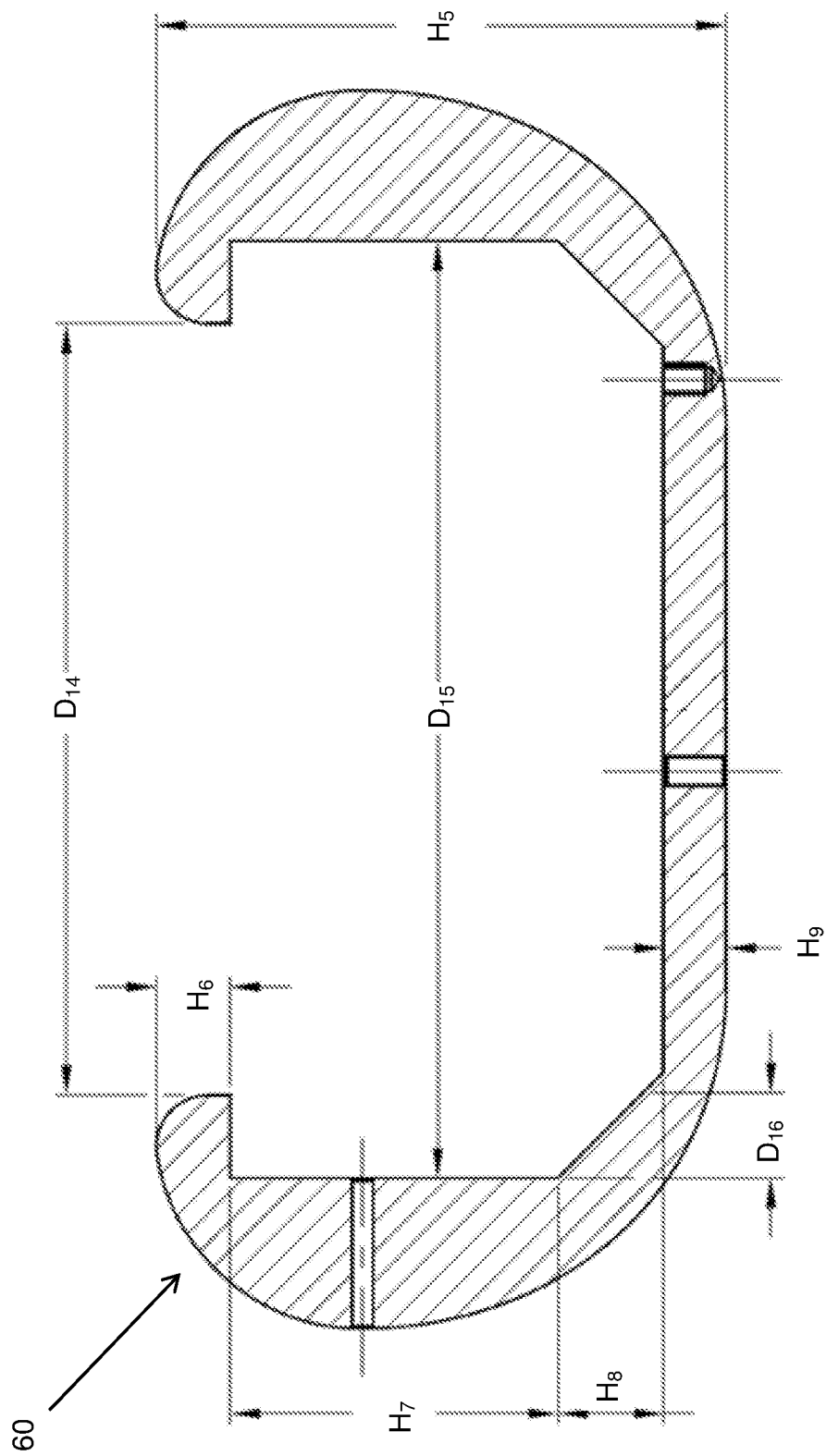
FIG. 5A shows a cross-sectional view of a second embodiment of a high voltage anode terminal in accordance with the present invention.
Figure 5B:
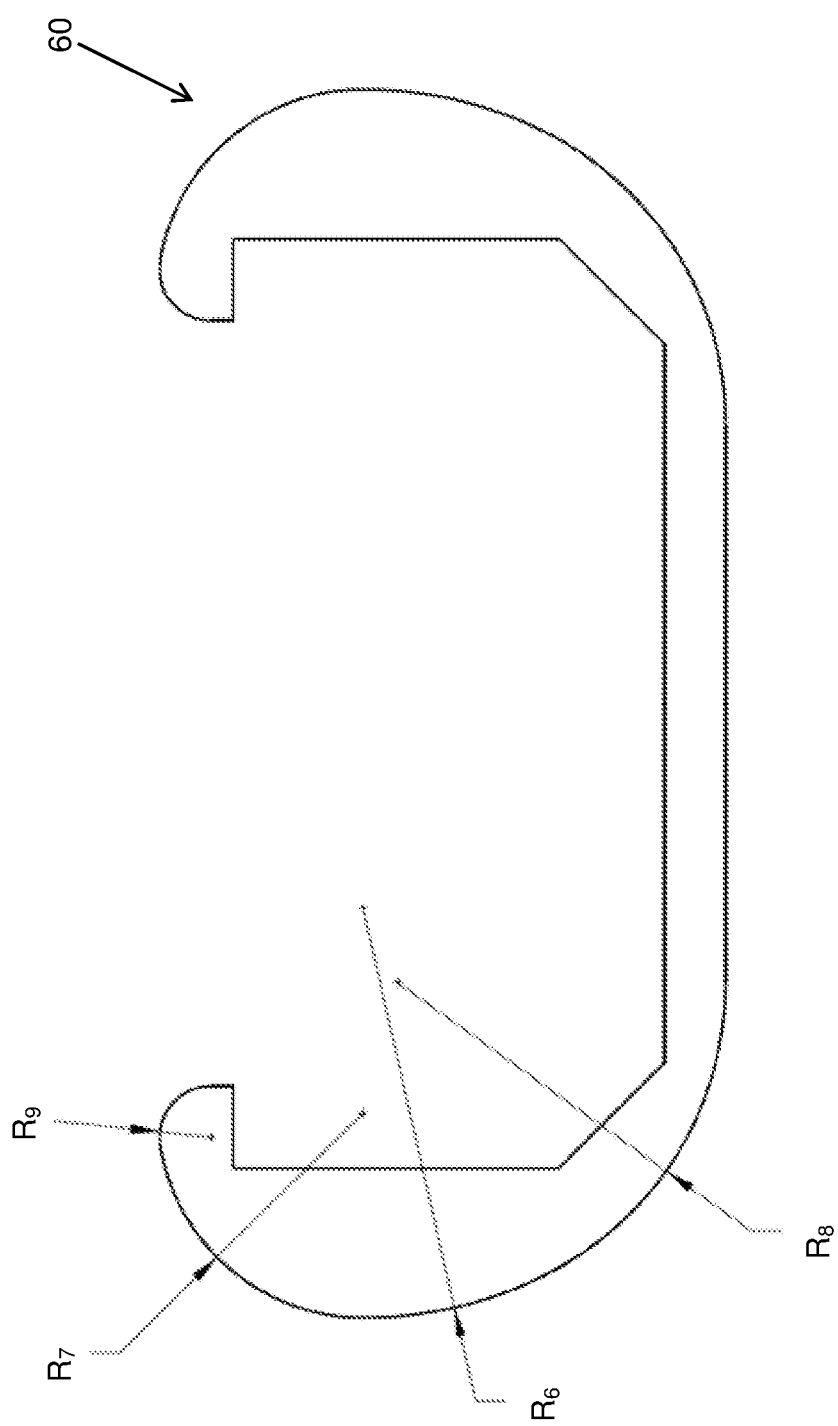
FIG. 5B shows a further cross-sectional view of a second embodiment of a high voltage anode terminal in accordance with the present invention.

Alternative embodiments of the high voltage anode terminal of the present invention may be provided without departing from the scope of the invention. One example of such an alternative embodiment is shown in FIGS. 5A and 5B, which illustrate a high-voltage anode terminal 60. The high-voltage anode terminal 60 does not include a central disc, as in the previous embodiments. The high-voltage anode terminal 60 may be configured for use with a higher voltage cable well, such as 225 kV, and in an enclosure having dimensions that differ from the enclosures of FIGS. 1-4. In one exemplary embodiment of the high-voltage terminal 60 shown in FIGS. 5A-5B, the possible dimensions of the high-voltage terminal 60 may be, approximately:

TABLE 1

| | |
|---|---|
| $D_{14}$ | 4.67 inches |
| $D_{15}$ | 5.67 inches |
| $D_{16}$ | 0.5 inches |
| $H_5$ | 3.45 inches |
| $H_6$ | 0.45 inches |
| $H_7$ | 2.0 inches |
| $H_8$ | 0.64 inches |
| $H_9$ | 0.37 inches |
| $R_6$ | 2.5 inches |
| $R_7$ | 1.25 inches |
| $R_8$ | 2.0 inches |
| $R_9$ | 0.313 inches |

It should be understood that, unless stated otherwise herein, any of the features, characteristics, alternatives or modifications described regarding a particular embodiment herein may also be applied, used, or incorporated with any other embodiment described herein. Additionally, the drawings herein may not be drawn to scale in whole or in part. The various dimensions of the elements of the invention that are referenced herein may be modified without departing from the scope of the invention.

Although the invention has been described and illustrated with respect to exemplary embodiments thereof, the foregoing and various other additions and omissions may be made therein and thereto without departing from the spirit and scope of the present invention.

What is claimed:

1. An apparatus comprising:
an enclosure containing:
   a cable well having a ground end affixed to a wall of the enclosure and a high voltage end opposing the ground end; and
   an anode terminal affixed to the high voltage end of the cable well, comprising a toroid configured to reduce high voltage arcing,
   wherein the toroid of the anode terminal comprises an outer surface having a plurality of radii of curvature, and
   wherein the largest radius of curvature of the outer surface of the toroid of the anode terminal is along a section around the outer surface of the toroid having one or more points on the outer surface that are closest to the enclosure, and
   wherein the plurality of radii of curvature of the outer surface of the toroid of the anode terminal include a plurality of intermediate radii of curvature less than the largest radius of curvature.

2. The apparatus according to claim 1, wherein the anode terminal further comprises a disc in a hole in a center of the toroid configured to connect the anode terminal to the high voltage end of the cable well.

3. The apparatus according to claim 2, wherein the toroid of the anode terminal is substantially perpendicular to the cable well.

4. The apparatus according to claim 2, wherein the anode terminal is asymmetrical about a plane perpendicular to the cable well and parallel to the disc.

5. The apparatus according to claim 2, wherein corners of the toroid facing the center of the toroid are rounded.

6. The apparatus according to claim 2, further comprising an insulating medium in the enclosure surrounding the cable well and the anode terminal.

7. The apparatus according to claim 2, wherein the anode terminal, including the toroid and the disc, are made from aluminum.

8. The apparatus according to claim 2, wherein the anode terminal, including the toroid and the disc, are made from brass.

9. The apparatus according to claim 2, wherein the largest radius of curvature of the outer surface of the toroid of the anode terminal is approximately 3 inches and the distance between the enclosure and the one or more points along the section around the outer surface of toroid having the largest radius of curvature is approximately 4.5 inches.

10. An apparatus comprising:
an enclosure containing:
   a cable well having a ground end affixed to a wall of the enclosure and a high voltage end opposing the ground end;
   an anode terminal affixed to the high voltage end of the cable well, comprising a toroid configured to reduce high voltage arcing, and
   wherein the toroid of the anode terminal comprises an outer surface having a plurality of radii of curvature, and
   wherein the largest radius of curvature of the outer surface of the toroid of the anode terminal is along a section around the outer surface of the toroid having one or more points on the outer surface that are closest to the enclosure, and
   wherein the distance between the enclosure and the one or more points along the section around the outer surface of toroid having the largest radius of curvature is approximately 1.5 times greater than the largest radius of curvature of the outer surface of the toroid of the anode terminal.

11. The apparatus according to claim 10, wherein the anode terminal further comprises a disc in a hole in a center of the toroid configured to connect the anode terminal to the high voltage end of the cable well.

12. An apparatus comprising;
an enclosure containing:
   a cable well having a ground end affixed to a wall of the enclosure and a high voltage end opposing the ground end;
   an anode terminal affixed to the high voltage end of the cable well, comprising a toroid configured to reduce high voltage arcing, and
   a disc in a hole in a center of the toroid configured to connect the anode terminal to the high voltage end of the cable well;
   wherein the toroid of the anode terminal comprises an outer surface having a plurality of radii of curvature,
   wherein the largest radius of curvature of the outer surface of the toroid of the anode terminal is along a section around the outer surface of the toroid having one or more points on the outer surface that are closest to the enclosure; and
   wherein the disc in the center of the toroid is offset towards a ground side of the anode terminal.

13. An apparatus comprising:
   an anode terminal comprising a toroid configured to reduce high voltage arcing,
   wherein the toroid of the anode terminal comprises an outer surface having a plurality of radii of curvature, wherein the largest radius of curvature of the outer surface of the toroid of the anode terminal is along a section around the outer surface of the toroid having one or more points on the outer surface that are configured to be closest to a wall of an enclosure housing the anode terminal, and wherein the plurality of radii of curvature of the outer surface of the toroid of the anode terminal include a plurality of intermediate radii of curvature less than the largest radius of curvature.

14. The apparatus according to claim 13, wherein the anode terminal further comprises a disc in a hole in a center of the toroid configured to connect the anode terminal to a high voltage end of a cable well.

15. The apparatus according to claim 14, wherein the anode terminal is asymmetrical about a plane parallel to the disc.

16. The apparatus according to claim 14, wherein corners of the toroid facing the center of the toroid are rounded.

17. The apparatus according to claim 14, wherein the anode terminal, including the toroid and the disc are made from aluminum or brass.

18. The apparatus according to claim 14, wherein the largest radius of curvature of the outer surface of the toroid of the anode terminal is approximately 3 inches.

19. The apparatus according to claim 13, wherein the anode terminal further comprises a disc in a hole in a center of the toroid configured to connect the anode terminal to the high voltage end of the cable well.

20. An apparatus comprising;
an anode terminal comprising a toroid configured to reduce high voltage arcing and a disc in a hole in a center of the toroid configured to connect the anode terminal to a high voltage end of a cable well, wherein the toroid of the anode terminal comprises an outer surface having a plurality of radii of curvature, wherein the largest radius of curvature of the outer surface of the toroid of the anode terminal is along a section around the outer surface of the toroid having one or more points on the outer surface that are configured to be closest to a wall of an enclosure housing the anode terminal, and wherein the disc in the center of the toroid is offset towards a ground side of the anode terminal.

* * * * *